United States Patent [19]

Folmsbee et al.

[11] Patent Number: 5,424,653
[45] Date of Patent: Jun. 13, 1995

[54] GRADUAL ON OUTPUT BUFFER CIRCUIT INCLUDING A REVERSE TURN-OFF APPARATUS

[75] Inventors: Alan C. Folmsbee, Santa Clara; Kyoung Kim, San Jose, both of Calif.

[73] Assignee: Advanced Micro Devices, Inc., Sunnyvale, Calif.

[21] Appl. No.: 132,548

[22] Filed: Oct. 6, 1993

[51] Int. Cl.6 .................. H03K 17/16; H03K 19/0175
[52] U.S. Cl. ......................... 326/26; 326/29; 326/90; 326/91; 326/86
[58] Field of Search ............... 307/443, 451, 475; 326/26, 29, 86, 89, 90, 91

[56] References Cited

U.S. PATENT DOCUMENTS

| | | | |
|---|---|---|---|
| 4,495,626 | 1/1985 | Brunin et al. | 307/443 |
| 4,719,369 | 12/1988 | Asano et al. | 307/443 |
| 4,725,747 | 2/1988 | Stein et al. | 307/443 |
| 4,885,485 | 12/1989 | Leake et al. | 307/443 |
| 5,036,222 | 7/1990 | Davis | 307/443 |
| 5,036,232 | 7/1991 | Jungert et al. | 307/443 |
| 5,061,864 | 10/1991 | Rogers | 307/443 |
| 5,097,149 | 3/1992 | Lee | 307/443 |
| 5,099,148 | 3/1992 | McClure et al. | 307/443 |
| 5,103,118 | 4/1992 | Peterson | 307/443 |

*Primary Examiner*—Edward P. Westin
*Assistant Examiner*—Richard Roseen
*Attorney, Agent, or Firm*—Joseph A. Sawyer, Jr.; Judy M. Maher; Raymond Kam-On Kwong

[57] ABSTRACT

An output buffer circuit is provided which significantly reduces ground/Vcc bounce and glitches of signals provided to an integrated circuit. The circuit includes a plurality of transistors for providing a drive potential at the output of the device. The transistors are coupled such that they increase in size from the input to the output of the output buffer circuit. A control circuit provides control signals for sequentially turning off the transistors from the largest to smallest device thereby substantially reducing the Vcc bounce and glitches of the signals provided to the integrated circuit by the output buffer circuit.

22 Claims, 6 Drawing Sheets

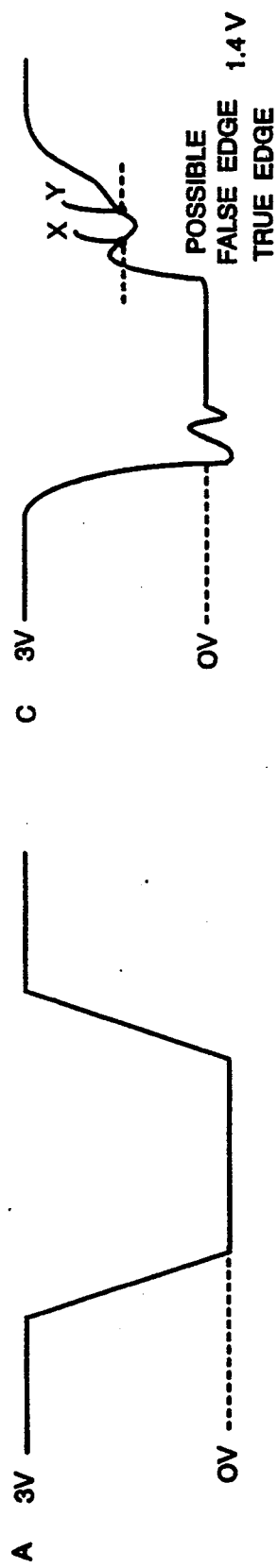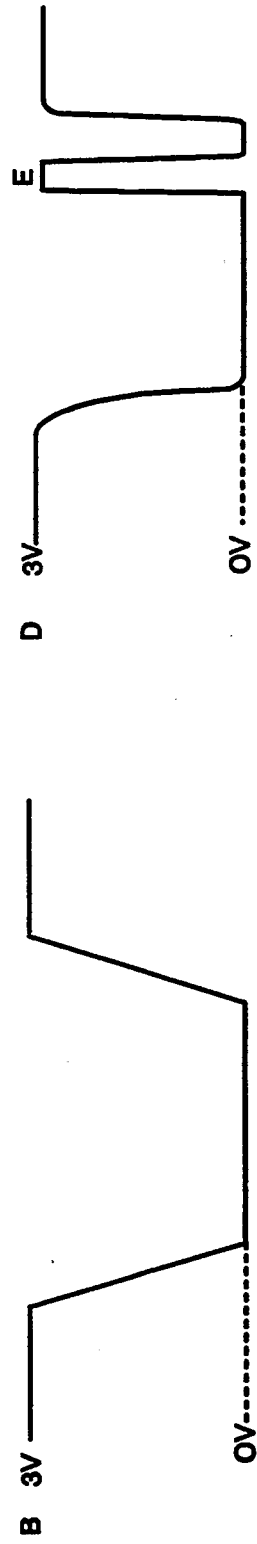

GRADUAL ON OUTPUT BUFFER CIRCUIT INCLUDING A REVERSE TURN-OFF APPARATUS

FIELD OF THE INVENTION

The present invention relates generally to output buffer circuits and more particularly to an output buffer circuit for small computer system interface (SCSI) devices that will limit noise problems associated with such devices.

BACKGROUND OF THE INVENTION

An integrated output buffer circuit oftentimes receives digital signals from transmission lines to provide an input signal to a downstream integrated circuit. It is known that even though the ideal input signal is a rectangular signal which has straight edges, transmission line signals are noisy. Most common noise sources are ground/Vcc bounce on output buffers, reflection through transmission lines and cross-talk. When the noisy signals are received at integrated circuit inputs, these noisy signals produce false edges which can cause improper circuit operation.

As is generally well known, in order to provide smaller and faster devices in CMOS process technology, circuits have a reduced scaling or a shrinking of the geometries thereof. For example, the channel length of the devices, which have been around 1.6 microns, are further reduced to under 1 micron so as to achieve higher speeds of operation. In particular, when the channel length of the device decreases, delay through the device will be reduced so as to yield a faster device. However, the shrinking of the sizes of the integrated semiconductor devices to a smaller size has not been accomplished without any resulting problems. In general, the faster output transitions cause the higher ground/Vcc bounces and bigger reflection on the line. Such semiconductor devices of reduced dimensions fail generally from being more noise sensitive (i.e., lower noise immunity) and being not capable of providing reliable data transfer.

One application where noise immunity and reliable data transfer becomes important is in the field of data transmission on a fully loaded Small Computer System Interface (SCSI) bus line which is coupled from a transmission line for communication in computer systems. The basic problem encountered when transferring data on the SCSI bus line is due to noise causing glitches. Glitches in the signal may cause double strobing of the data. The glitches are more hazardous when they appear on the request (REQ) and acknowledge (ACK) lines.

The control signals REQ and ACK are used to perform a "handshake" in asynchronous mode so as to transfer the data back and forth between a target (for example, a disc drive) and an initiator (for example, a host computer). A glitch occurring in the control signal ACK can cause one or more extra bytes to be counted during data transfers at the transfer rate of between 1.0–10 Mbytes/sec. On the other hand, the incorrect or wrong data could be transferred such as when an early control signal ACK occurs and the data signal lines are still being settled, thus causing the wrong data to be sampled.

One way to alleviate this noise problem is to reduce the signal rise and fall rate, commonly known as slew rate. A smaller device will have a reduced slew rate and accordingly, less noise. However, output buffers usually require large device sizes to meet a sinking current $I_{oI}$ specification. For instance, SCSI outputs require $I_{oI}=48$ milliampere (sinking current when signal is asserted, or at low-level). A smaller device may not be able to sink enough current to meet the $I_{oI}$ specification. Therefore, employing a smaller device alone is not enough to solve the noise problem.

In prior arts, output buffers are segmented in several smaller devices and turned on sequentially through delay elements. In order to minimize noise when a high-to-low transition (falling edge) occurs at the output of the device (when device is being asserted), the devices should be sequentially turned on from the smallest to the largest size. Unfortunately, this arrangement doesn't help to minimize noise in the case of a low-to-high transition (rising edge) at the output of the device. When the smallest device is turned off first, the sinking current of the output device (composed of pull-down transistors) remains high because most of the sinking current is still being provided by the larger devices. Consequently, the voltage level at the output buffer remains relatively low until the largest device is turned off. Accordingly, turning off the largest device last would still give an abrupt voltage transition sufficient to generate the hazardous noise at the rising edge of the output. Therefore, in order to minimize noise during the rising edge, the turn-off sequence of the output buffers is required to be from the largest to the smallest size - a reverse order of the high-to-low transition.

One way of addressing the noise problem in case of a low-to-high transition at the output is to use an active negation circuit that pulls up the output signal fast such that the glitch due to reflection happens out of the input threshold region. However, this solution is expensive. Besides, it is difficult to implement because of stringent design requirements. Specifically, in order to function properly, the active negation circuit should be fast but not faster than 5 ns and cannot leak current when the signal is deserted (negated, or at high-level). Therefore most of SCSI systems still employ a resistor, commonly known as a passive terminator, coupled between the output and the power supply Vcc. Thus, system problems often arise due to glitch on the rising edge of signals.

Accordingly, what is needed is a circuit to address the above-mentioned problems. More particularly, what is necessary is a circuit that will allow for the minimizing ground/Vcc bounce on a transmission line or the like during the time when the output signal makes a low-to-high transition as well as a high-to-low transition. Finally, the circuit should be one which is easily implemented in existing technologies. The present invention addresses the above described problems.

SUMMARY OF THE INVENTION

An output buffer circuit of the present invention is disclosed that minimizes noise. The output buffer circuit comprises a plurality of transistors responsive to the data input signal for providing a drive potential at an output of the output buffer circuit. The plurality of transistors being coupled such that the size of each of the transistors is larger than the preceding transistor from the input to the output of the output buffer circuit. The output buffer circuit also includes a control means responsive to the data input signal for providing a plurality of control signals for sequentially activating the plurality of transistors. The control means is coupled to each of the plurality of transistors and is responsive to the change of the input data signal state from a first state to the second state for turning off the plurality of transistors sequentially starting from the largest size to the smallest size.

In an aspect of the present invention the control circuit includes a logic circuit for responding to a change of state of the data input signal from a first state to the second state by turning off the plurality of transistors.

In yet another aspect of the present invention includes a first plurality of delay means so that the plurality of transistors are turned off sequentially starting from the largest size to smallest size.

In yet another aspect a logic gate turns off the logic circuit when an input data signal changes from the second state to the first state.

BRIEF DESCRIPTION OF THE DRAWINGS

FIGS. 1 A-D show a comparison of an ideal input signal to a noisy input signal and their corresponding output signals.

DETAILED DESCRIPTION

The present invention relates to an improvement to an output buffer circuit utilized with an integrated circuit. The following description is presented to enable one of ordinary skill in the art to make and use the invention as provided in the context of a particular application and its requirements. Various modifications to the preferred embodiment will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Referring now to FIG. 1A, what is shown is a waveform of an ideal input signal to an integrated circuit indicated by the designator A which is, as seen for this example, between 0 and 3 volts. FIG. 1B shows the waveform at the output of the integrated circuit, as indicated by the designator B, in response to the ideal input signal. In FIG. 1C, as indicated by the designator C, is a waveform of a noisy input signal to an integrated circuit which has the same "true" rising and falling edges. By true edge is meant an edge that is followed by a level that does not change for a significant amount of time. By "possibly false edge" is meant an edge that is followed by a change in the signal state during a short time. The "possibly false edge" may have been a true edge if transmission line reflections did not occur. As is seen, the noisy input signal has reflections therein shown by X and Y which comprise areas that could be detected as false edges. Accordingly the noisy input signal shown produces a possible false edge rising past the 1.4 volt logic threshold level and a true edge rising past the 1.4 volt threshold (in this example 1.4 volts is chosen because it is halfway between the TTL load current 0.8 voltage and high at 2.0 volts). FIG. 1D shows the waveform at the output of the integrated circuits, as indicated by the designator D, in response to the noisy input signal. In this embodiment, double strobing E occurs due to the "possible false edge." For many applications, such as SCSI chips, the rising false edges can cause improper circuit operation because they are followed by falling edges and vice versa. Hence, it is important to have circuitry that can minimize these types of false edges.

Figure 2A:
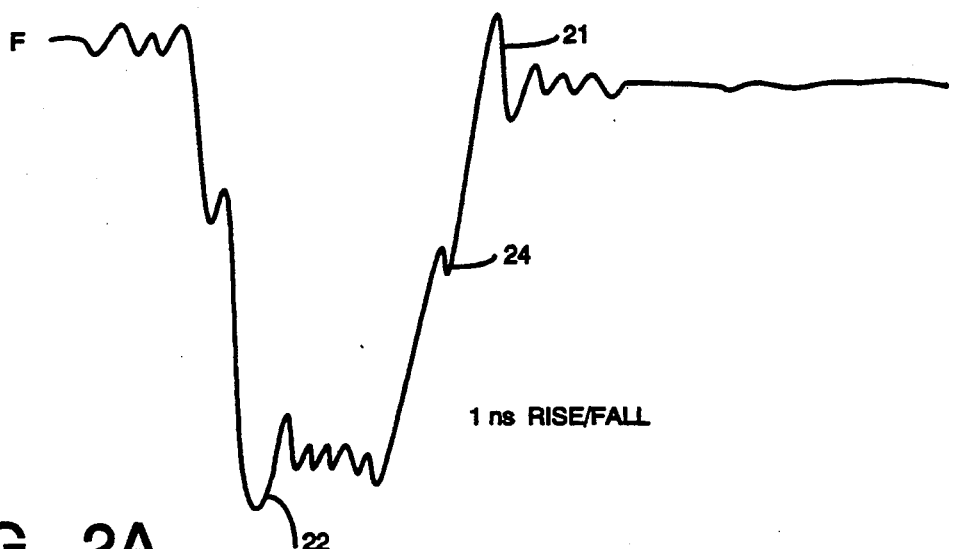
FIGS. 2 A-B shows a comparison of input signals with different rise and fall times.

Referring now to FIG. 2A, what is shown is a waveform of an input signal with a rise and fall time of 1 nanosecond to an integrated circuit indicated by the designator F. Ground bounce 22 occurs at the falling edge of F, while a glitch 24 and Vcc bounce 21 occur at the rising edge.

Figure 2B:
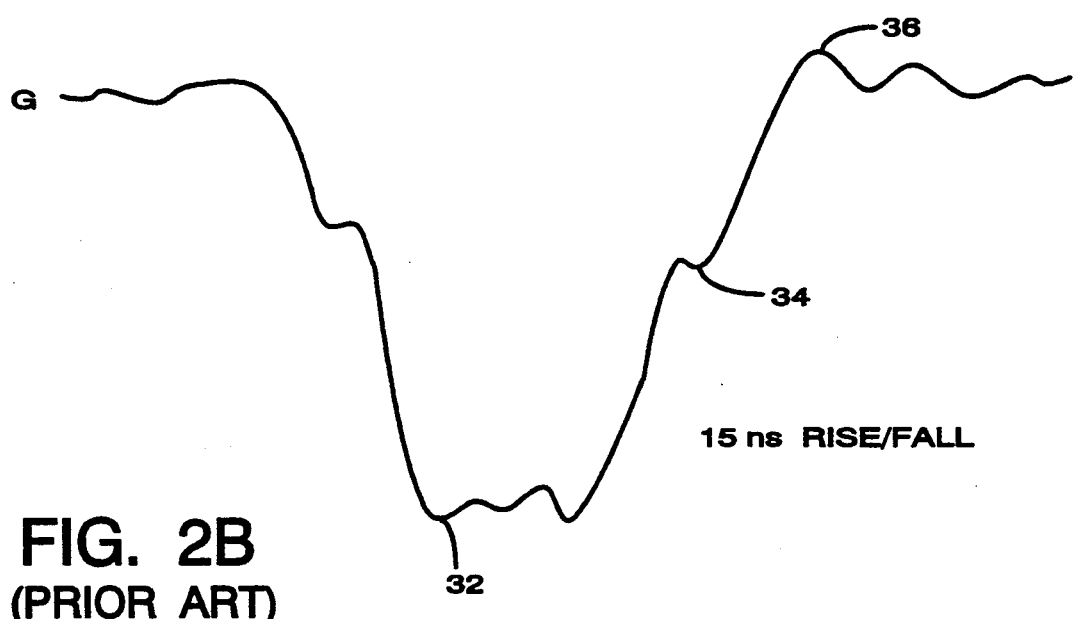

Referring now to FIG. 2B, what is shown is a waveform of another input signal with a rise and fall time of 15 nanosecond to the integrated circuit indicated by the designator G. The input signal waveform G has significantly reduced ground bounce 32, glitch 34 and Vcc bounce 36. Accordingly, by reducing the slew rate, the noise problem will be alleviated. However, as explained earlier, while a smaller device has reduced slew rate, it may not be able to sink enough current to meet the low specification. Therefore, using smaller device alone is not sufficient to solve the noise problem.

Figure 3:
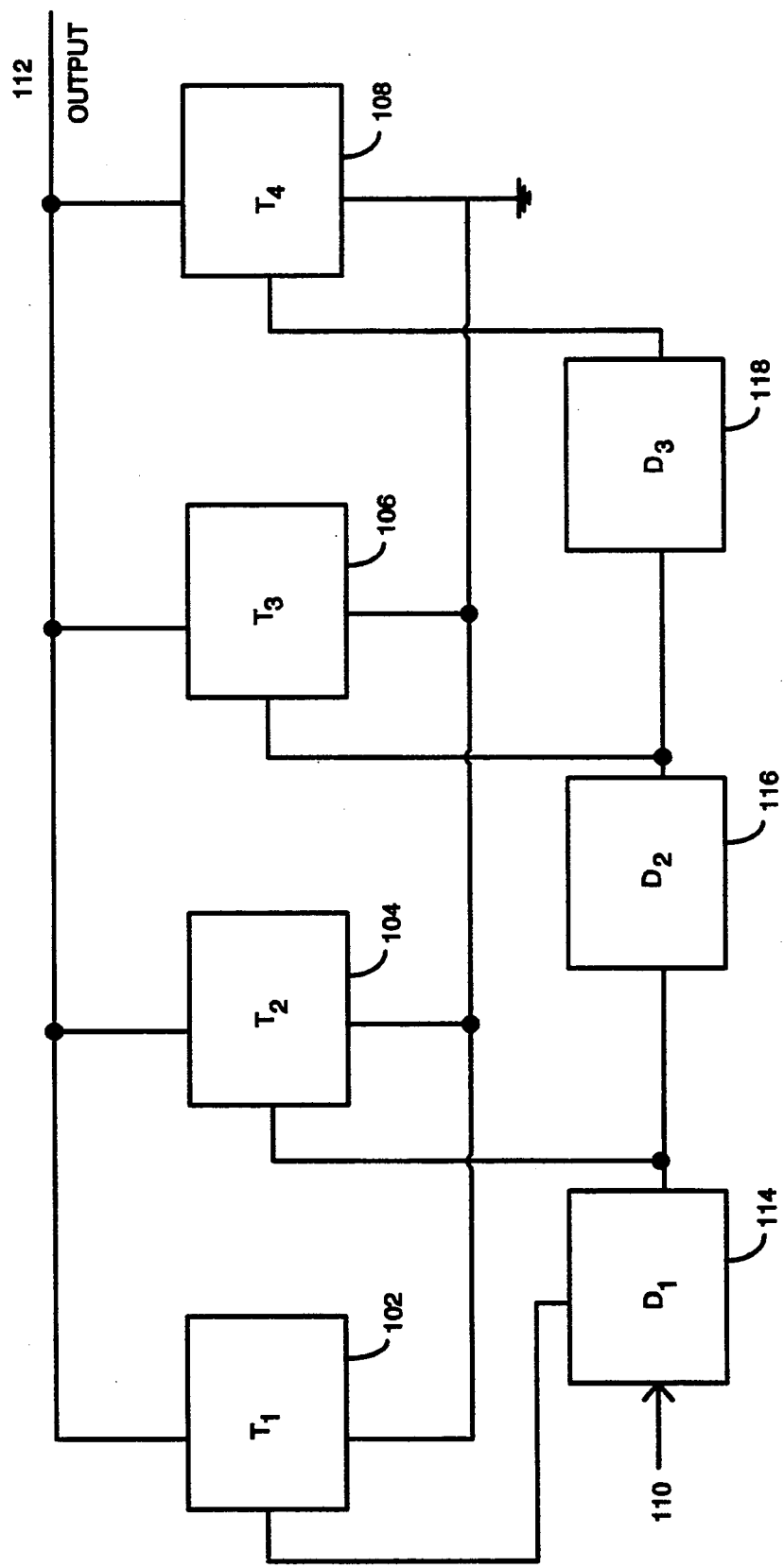
FIG. 3 is a block diagram of a prior art output buffer circuit.

A known circuit for minimizing ground bounce or ringing on the output is one that "gradually turns on" the output. Referring now to FIG. 3, shown in block diagram form is a circuit 100 for performing such a function. The circuit 100 comprises a plurality of transistors 102, 104, 106 and 108 coupled in parallel from an input 110 to an output 112. The transistors 102, 104, 106, and 108 are such that they increase in size from input 110 to output 112, that is transistor 104 is larger than transistor 102, transistor 106 is larger than transistor 104 and transistor 108 is larger than transistor 106. In this embodiment, delay element 114 is coupled between transistors 102 and 104, delay element 116 is coupled between transistors 104 and 106, and delay element 118 is coupled between transistors 106 and 108. Delay element 114 is also coupled in series with delay element 116 and delay element 116 is also coupled in series with delay element 118.

In this embodiment, the output signal is complementary to the input signal, i.e. a pull-down transistor is utilized such that when the input signal makes a high to low transition, the output signal will make a low to high transition and visa versa. When a logic transition occurs at input 110 (low to high or high to low) transistor 102 turns on first, then transistor 104 turns on through delay element 114, then transistor 106 turns on through delay element 116 and finally transistor 108 turns on through delay element 118.

As has been above mentioned, the transistors 102, 104, 106 and 108 increase in size such that as each transistor turns on the output gradually turns on. This type of circuit 100 provides for reduced ground bounce or ringing when the output signal of the circuit makes a high to low logic transition. However, when a pull down transistor is utilized, it has been found that during low to high logic transitions of the output signal this type of arrangement would turn-off too fast causing a glitch due to reflection and ringing (Vcc bounce) on the output.

This ringing is a result of the driver circuit 100 sequentially turning off from the smallest transistor 102 to the largest transistor 102. Accordingly, what is needed is an improvement to the above-identified output buffer circuit 100 while maintaining the advantages of its operation.

Figure 4:
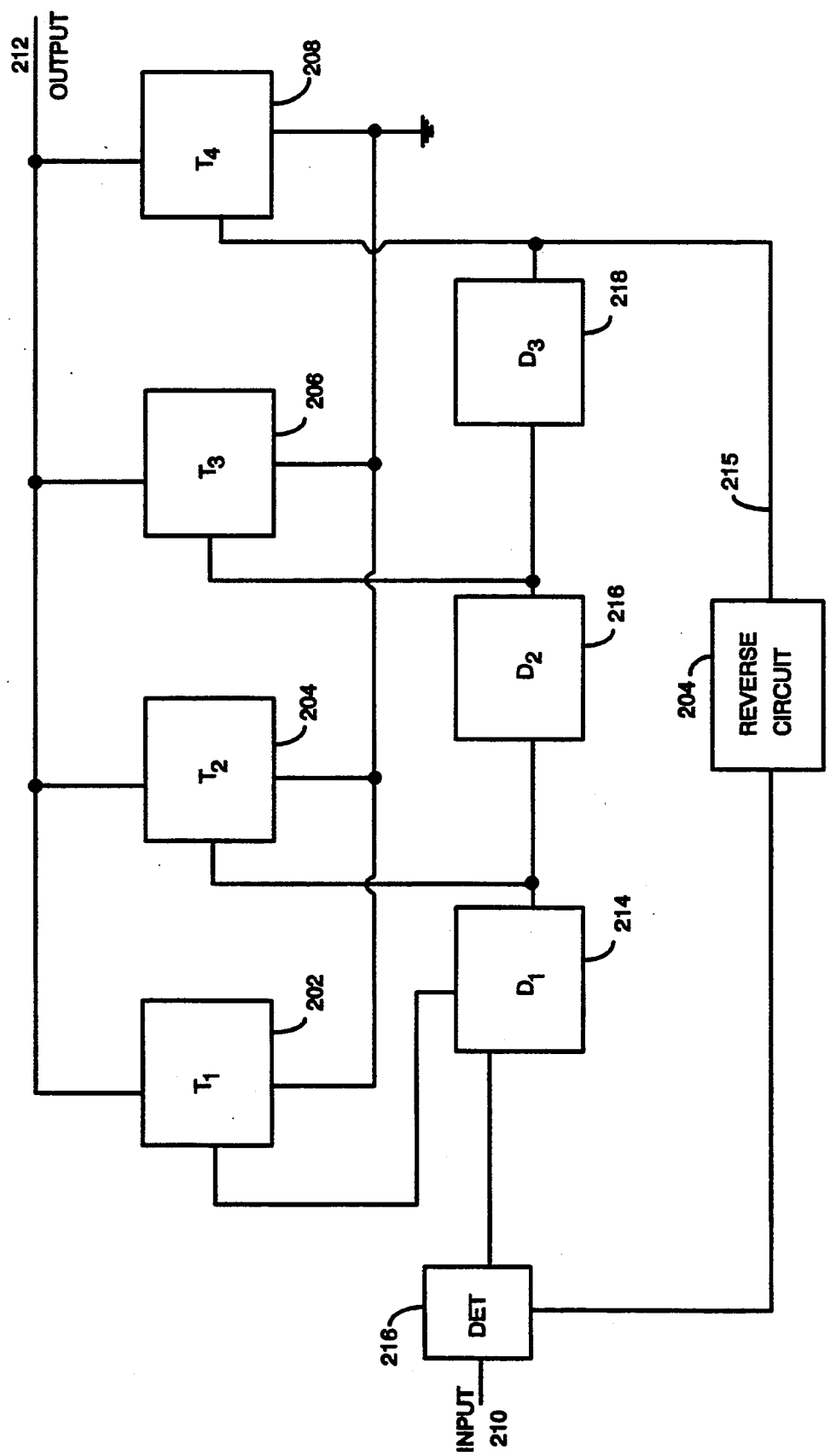
FIG. 4 is a block diagram of an output buffer circuit in accordance with the present invention.

Referring now to FIG. 4, what is shown is a block diagram of a gradual output buffer circuit 200 including a reverse turn off apparatus in accordance with the present invention.

Accordingly transistors 202, 204, 206 and 208 correspond to and are coupled in the same way as transistors 102, 104, 106 and 108 of FIG. 3. Similarly, delay elements 214, 216 and 218 correspond to and are coupled in the same way as delay elements 114, 116 and 118 of FIG. 3. Also included in circuit 200 is a detector 216 that detects whether there is a low to high logic transition signal or a high to low logic transition signal at input terminal 210. Similarly, the output signal is complementary to the input signal, i.e. when the input signal makes a high to low transition, the output signal will make a low to high transition and visa versa. In operation, if a low to high transition signal is detected at input terminal 210, transistors 202, 204, 206 and 208 are turned on sequentially that is, the transistors are turned on from the smallest to the largest in size. If a high to low transition signal is detected at input terminal 210, then the reverse circuit 214 via connection 215 causes transistors 208, 206, 204 and 202 to be turned off sequentially thereby turning off the transistors from largest to the smallest in size.

In so doing, the Vcc bounce and glitches caused by low to high signal transitions at the output terminal 212 is substantially minimized while at the same time allowing for attendant advantages in gradually turning on transistors during high to low signal transitions at output terminal 212. Although the above described output buffer circuit has been described utilizing four transistors from input to output, it should be recognized that any number of transistors can be utilized and that number would be within the spirit and scope of the present invention.

Figure 5:
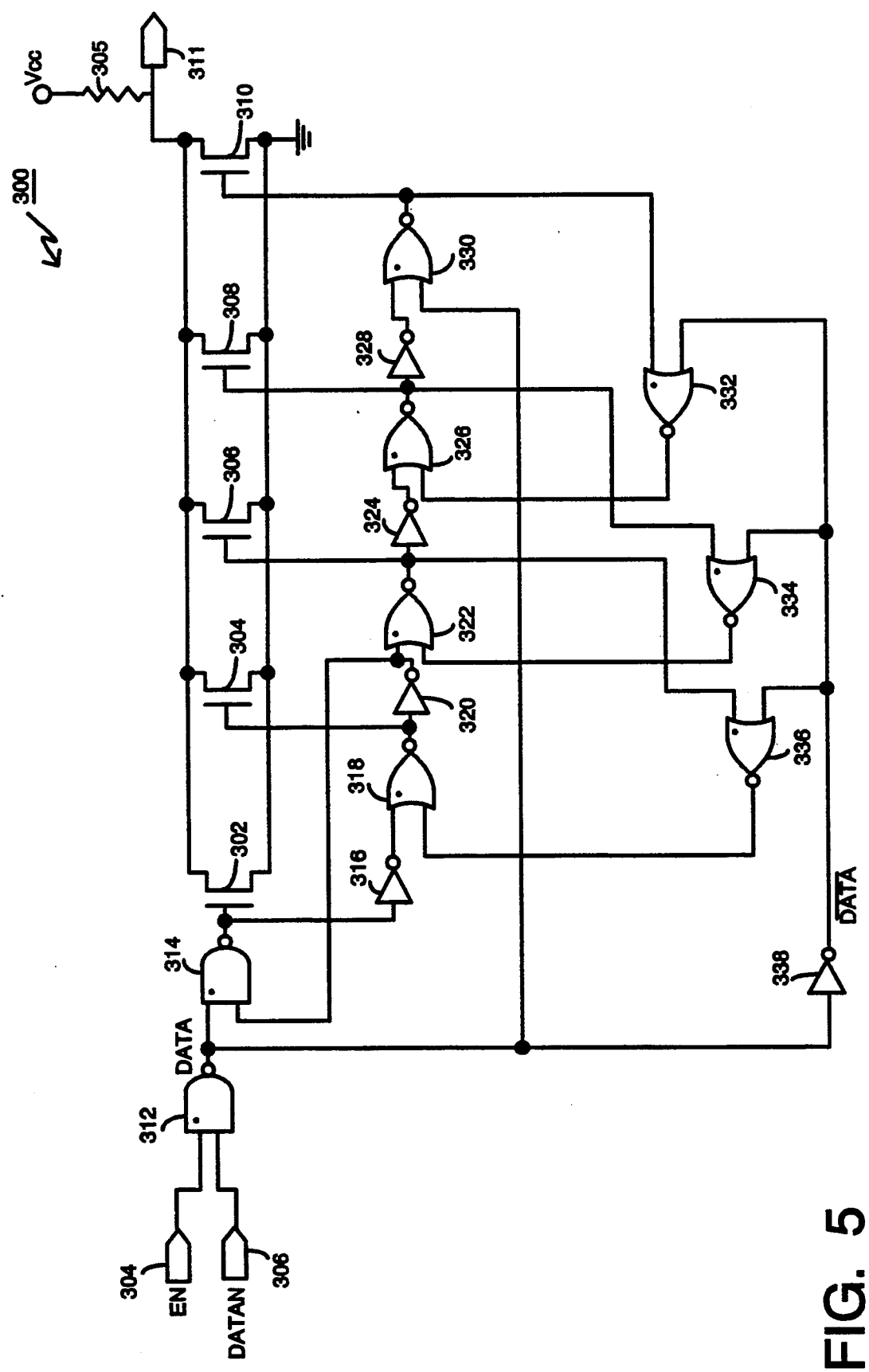
FIG. 5 is a more detailed diagram of the output buffer circuit of FIG. 4.

Referring now to FIG. 5, what is shown is a detailed diagram of an output buffer circuit 300 in accordance with the present invention. The output buffer circuit 300 includes an NAND gate 312 which receives an enable (EN) signal at a first terminal 304 and a data signal at a second terminal 306. The output of NAND gate 312 is coupled to one input of NAND gate 314, one input of NOR gate 330 and an inverter 338. The output of inverter 338 is coupled to one input of NOR gates 332, 334 and 336, respectively. The other input of NAND gate 314 is coupled to the output of inverter 320. The output of inverter 320 is also coupled to one input of NOR gate 322.

The output of NAND gate 314 is coupled to the gate of transistors 302. Transistors 302, 304, 306, 308 and 310 are coupled in parallel with the drain of transistors being coupled to an output terminal 311 and the source of transistors being coupled to ground. Output terminal 311 is also coupled to one terminal of resistor 305. The other terminal of resistor 305 is coupled to a power supply Vcc. The output of NAND gate 314 is also coupled to the input of inverter 316. The output of inverter 316 is coupled to one input of NOR gate 318. The other input of NOR gate 318 is coupled to the output of NOR gate 336. The output of NOR gate 318 is coupled to the input of inverter 320 and the gate of transistor 304.

The output of inverter 320 is coupled to one input of NOR gate 322. The other input of NOR gate 322 is coupled to the output of NOR gate 334. The output of NOR gate 322 is coupled to the gate of transistor 306, the input of inverter 324, and the other input of NOR gate 336. The output of inverter 324 is coupled to one input of NOR gate 326. The other input of NOR gate 326 is coupled to the output of NOR gate 332.

The output of NOR gate 326 is coupled to the input of inverter 328, the gate of transistor 308 and the other input of NOR gate 334. The output of inverter 328 is coupled to a second input of NOR gate 330. The output of NOR gate 330 is coupled to the gate of transistor 310 and the other input of NOR gate 332.

In this embodiment, the inverter-NOR gate combinations (316, 318), (320, 322), (324, 326) and (328, 330) comprise respective delay elements between the various transistors 302, 304, 306, 308 and 310 when output terminal 311 is turned on (high-to-low transition). The reversing circuit, in this embodiment, comprises NOR gates 332, 334 and 336 in combination with the inverter 338. The gate combinations (332, 326), (334, 322), (336, 318) and (320, 314) comprise respective delay elements between the various transistors 310, 308, 306, 304 and 302, when output terminal 311 is turned off (low-to-high transition). Finally the detector comprises NAND gate 312.

In this particular embodiment, transistor 302 has a width to length (W/L) ratio of 50/2, transistor 304 has a W/L ratio of 136/2, transistor 306 has a W/L ratio of 340/2, transistor 308 has a W/L ratio of 544/2 and transistor 310 has a W/L ratio of 638/2. Hence, the transistors 302, 304, 306, 308 and 310 increase in size from the input of the output buffer circuit to the output of the circuit. As has been before mentioned the specific W/L ratio are not critical, what is important, however, is that the transistors be of different sizes and be coupled accordingly to the present invention to minimize ground bounce by controlling the rate of current flow at the output terminal 311 through transistor 302, 304, 306, 308 and 310.

In this embodiment, NAND gate 314 has W/L ratio of 5/3 and 5/4 for its PMOS and NMOS transistors respectively, NOR gate 318 has W/L ratio of 5/2 and 5/4 for its PMOS and NMOS transistors respectively, NOR gate 322 has W/L ratio of 10/2 and 10/2 for its PMOS and NMOS transistors respectively, NOR gate 326 has W/L ratio of 30/2 and 15/2 for its PMOS and NMOS transistors respectively, NOR gate 330 has W/L ratio of 30/2 and 15/2 for its PMOS and NMOS tranisistors repsectively. Again, the specific W/L ratio are not important, what is important, however, is that NAND gate 314 and NOR gates 318, 322, 326 and 330 have small W/L so that slow rise time and fall time are achieved. This helps to minimize ground and Vcc bounce.

Furthermore, in this embodiment, inverter 316 has W/L ratio of 5/2 and 10/2 for its PMOS and NMOS transistors respectively, inverters 320, 324 and 328 have W/L ratio of 5/2 for all of its PMOS and NMOS transistors. The specific W/L ratio here are for illustrative purpose only. What is important is that Inverter 316, 320, 324 and 328 have small W/L and that each inverter can be turn on (or turn off) prior to the immediate preceding gate being fully turn on (or fully turn off). As a result, transistor 302, 304, 306, 308 and 310 can be gradually turn on and turn off so that glitches can be minimized during high-to-low and low-to-high transistor at output terminal 311.

The circuit 300 operates in the following manner. When a data input (DATAN) signal arrives indicating a low to high transition and with the enable signal at high, the output of NAND gate 312 will be low, thereby making the output of NAND gate 314 initially high. Since the output of NAND gate 312 is low, the output of inverter 338 is high thereby shutting off reversing circuit and allowing for transistors 302, 304, 306, 308 and 310 to be turned on sequentially through operation of inverter-NOR gate combination delays (316, 318), (320, 322), (324, 326) and (328, 330). Accordingly, the output signal at output terminal 311 will make a high to low transition.

However, when the data input signal arrives indicating a high to low transition, a low to high transition occurs the output of NAND gate 312 which enables NOR gate 330 to make a high to low transition, thereby turning off transistor 310. Transistors 308, 306, 304 and 302 sequentially turn off through the operation of the inverter 338 and the combination of gate delays (332, 326), (334, 322), (336, 318) and (320, 314). In response, the output signal at output terminal 311 will make a low to high transition.

Therefore, inverter-NOR gate combination (316, 318), (320, 322), (324, 326) and (328, 330) controls the turn on of the transistors 302, 304, 306, 308 and 310 from the smallest to the largest size when the output signal makes a high to low logic transition. However, when the output signal makes a low to high logic transition, the inverter 338 in combination with delays through gate combination (332, 326), (334, 322), (336, 318) and (320, 314) control the turn off of the transistors 310, 308, 306, 304 and 302 from largest to the smallest size. Accordingly, the Vss bounce and glitch caused by low to high signal transitions at output terminal 311 is substantially minimized. At the same time, the ground bounce caused by high to low signal transitions at output terminal 311 is maintained at a minimum level by allowing the gradual turning on of the transistors from the smallest to the largest size.

Figure 6:
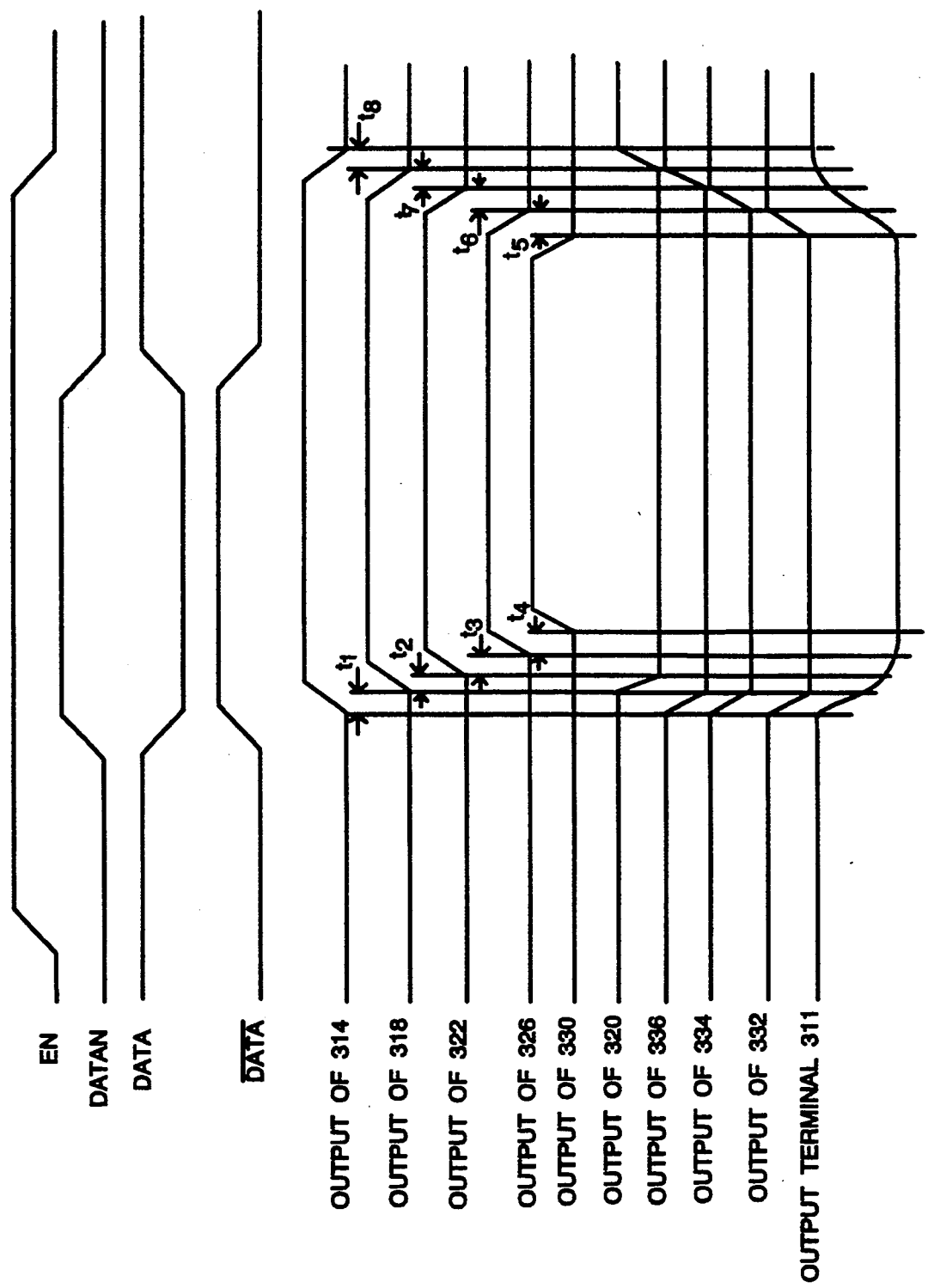
FIG. 6 is a detailed timing diagram of the output buffer circuit of FIG. 5.

Referring now to FIG. 6, what is shown is a detailed timing diagram of the output buffer circuit 300 in FIG. 5. When the output signal makes a high-to-low transition, transistors 302, 304, 306, 308 and 310 are turned on from the smallest to the largest size. Delay time t1 t2, t3 and t4 represents the delay through gate combination (316, 318), (320, 322), (324, 326), and (328, 330) respectively.

When the output signal makes a low-to-high transition, transistors 310, 308, 306, 304 and 302 are turned off from the largest to the smallest size. Delay time t5, t6, t7 and t8 represents the delay through gate combination (332, 326), (334, 322), (336, 318) and (320, 314), respectively.

It has been found through simulation that the path to turn on all of the transistors 302, 304, 306, 308 and 310 requires approximately 6 nanoseconds and that the path to turn off all the transistors is approximately 12 nanoseconds. It has also been found that this arrangement shows improved results over the prior art circuit with significantly less ringing when the output signal makes a low to high transition.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An output buffer circuit that receives a data input signal at one input terminal and an enable signal at a second input terminal and provides an output signal at an output terminal which has a significant reduction in noise, the data input signal changing level from a first level to a second level and from a second level to a first level, the buffer comprising:

a plurality of transistors responsive to the data input signal for providing a drive potential at the output terminal, the plurality of transistors being coupled in parallel such that one terminal of each transistor is coupled to the output terminal and a second terminal of each transistor is coupled to a ground terminal with the size of each transistor increasing from the preceding transistor from the input terminal to the output terminal; and a control circuit responsive to the data input signal for providing a plurality of control signals for sequentially activating the plurality of transistors, the control circuit being coupled to each of the plurality of transistors, the control circuit being responsive to the change of the input data signal level from the first level to the second level for turning off the plurality of transistors sequentially from the largest size to the smallest size.

2. The output buffer circuit as recited in claim 1, wherein the control circuit comprises a first control circuit and a second control circuit, the first control circuit being coupled to the second control circuit, the second control circuit being coupled to each of the plurality of transistors, the first control circuit being responsive to the change of the input data signal level from the first level to the second level for providing a first plurality of control signals to the second control circuit for turning off the plurality of transistors, so that the plurality of transistors are turned off sequentially starting from the largest size to the smallest size.

3. The output buffer circuit as recited in claim 2, wherein the first control circuit further comprises a first plurality of logic means responsive to the change of the input data signal level from the first level to the second level for turning off the plurality of transistors.

4. The output buffer circuit as recited in claim 3, wherein the first plurality of logic means comprise a first plurality of NOR logic gates.

5. The output buffer circuit as recited in claim 2, wherein the second control circuit comprises a first plurality of delay means for providing a first plurality of predetermined time delays between the turning off of each of the transistors, so that the plurality of transistors are turned off sequentially starting from the largest size to the smallest size.

6. The output buffer circuit as recited in claim 5, wherein the first plurality of delay means comprise a first plurality of inverters.

7. The output buffer circuit as recited in claim 5 wherein the first plurality of delay means comprise a second plurality of NOR logic gates.

8. The output buffer circuit as recited in claim 2, further comprises a logic gate responsive to the enable signal and the data input signal for turning off the first control circuit when the input data signal level changes from the second level to the first level.

9. The output buffer circuit as recited in claim 8, wherein the second control circuit comprises a second plurality of logic means formed of a third plurality of NOR logic gates, the third plurality of logic gates being responsive the change of the input data signal level from the second level to the first level for turning on the plurality of transistors, so that the plurality of transistors are turned on sequentially starting from the smallest size to the largest size.

10. The output buffer circuit as recited in claim 9, wherein the second control circuit comprises a second plurality of delay means for providing a second plurality of predetermined time delays between the turning on of each transistor, so that the plurality of transistors are turned on sequentially starting from the smallest size to the largest size.

11. The output buffer circuit as recited in claim 10, wherein the second plurality of delay means comprises a second plurality of inverters.

12. The output buffer circuit as recited in claim 10, wherein the second plurality of delay means comprise a fourth plurality of NOR logic gates.

13. An output buffer circuit that receives a data input signal at one input terminal and an enable signal at a second input terminal and provides an output signal at an output terminal which has a significant reduction in noise, the data input signal changing level from a first level to a second level and from a second level to a first level, the buffer comprising:
- a plurality of transistors responsive to the data input signal and providing a drive potential at the output terminal, the plurality of transistors being coupled in parallel such that one terminal of each transistor is coupled to the output terminal and a second terminal of each transistor is coupled to a ground terminal with the size of each transistor increasing from the preceding transistor from the input terminal to the output terminal; and
- a control circuit responsive to the data input signal for providing a plurality of control signals for sequentially activating the plurality of transistors, the control circuit being coupled to each of the plurality of transistors, the control circuit comprising a first plurality of NOR logic gates and a plurality of logic circuits, wherein
- the first plurality of NOR logic gates are coupled to the plurality of logic circuits, the plurality of logic circuits being coupled to a third terminal of each of the plurality of transistors, the first plurality of NOR logic gates being responsive to the change of the input data signal level from the first level to the second level for providing a first plurality of control signals to the plurality of logic circuits for turning off the plurality of transistors, so that the plurality of transistors are turned off sequentially starting from the largest size to the smallest size.

14. The output buffer circuit as recited in claim 13, wherein the plurality of logic circuits comprise a first plurality of delay circuits for providing a first plurality of predetermined time delays between the turning off of each transistor, so that the plurality of transistors are turned off sequentially starting from the largest size to the smallest size.

15. The output buffer circuit as recited in claim 14, wherein the first plurality of delay circuits comprises a first plurality of inverters.

16. The output buffer circuit as recited in claim 14, wherein the first plurality of delay circuits comprise a second plurality of NOR logic gates.

17. The output buffer circuit as recited in claim 13, further comprises a logic gate responsive to the enable signal and the data input signal for turning off the first plurality of NOR logic gates when the input data signal level changes from the second level to the first level.

18. The output buffer circuit as recited in claim 17, wherein the plurality of logic circuits comprise a third plurality of NOR logic gates, the third plurality of NOR logic gates being responsive to the change of the input data signal level from the second level to the first level for turning on the plurality of transistors, so that the plurality of transistors are turned on sequentially starting from the smallest size to the largest size.

19. The output buffer circuit as recited in claim 18, wherein the plurality of logic circuits comprises a second plurality of delay circuits for providing a second plurality of predetermined time delays between the turning on of each transistor, so that the plurality of transistors are turned on sequentially starting from the smallest size to the largest size.

20. The output buffer circuit as recited in claim 19, wherein the second plurality of delay circuits comprise a second plurality of inverters.

21. The output buffer circuit as recited in claim 19, wherein the second plurality of delay circuits comprise a fourth plurality of NOR logic gates.

22. An output buffer circuit that receives a data input signal at one input terminal and an enable signal at a second input terminal and provides an output signal at an output terminal which has a significant reduction in noise, the data input signal changing level from a first level to a second level and from a second level to a first level, the buffer comprising:
- a plurality of transistors responsive to the data input signal to provide a drive potential at the output terminal, the plurality of transistors being coupled in parallel such that one terminal of each transistor is coupled to the output terminal and a second terminal of each transistor is coupled to a ground terminal with the size of each transistor increasing from the preceding transistor from the input terminal to the output terminal;
- a control circuit responsive to the data input signal for providing a plurality of control signals for sequentially activating the plurality of transistors, the control circuit being coupled to each of the plurality of transistors, the control circuit comprising a first plurality of NOR logic gates and a plurality of logic circuits, wherein
- the first plurality of NOR logic gates are coupled to the plurality of logic circuits, the plurality of logic circuits being coupled to a third terminal of each of the plurality of transistors, the first plurality of NOR logic gates being responsive to the change of the input data signal level from the first level to the second level for providing a first plurality of control signals to the plurality of logic circuits for turning off the plurality of transistors, so that the plurality of transistors are turned off sequentially starting from the largest size to the smallest size, and
- the plurality of logic circuits comprise a second plurality of NOR logic gates, the second plurality of NOR logic gates being responsive to the change of the input data signal level from the second level to the first level for turning on the plurality of transistors, so that the plurality of transistors are turned on sequentially from the smallest size to the largest size; and
- a logic gate responsive to the enable signal and the data input signal to turn off the first plurality of NOR logic gates when the input data signal level changes from the second level to the first level.

* * * * *